United States Patent
Lee et al.

(10) Patent No.: US 8,980,663 B2
(45) Date of Patent: Mar. 17, 2015

(54) ORGANIC LIGHT EMITTING DIODE DISPLAY DEVICE AND METHOD OF FABRICATING THE SAME

(71) Applicants: Won-Kyu Lee, Yongin (KR); Kyu-Sik Cho, Yongin (KR); Tae-Hoon Yang, Yongin (KR); Byoung-Kwon Choo, Yongin (KR); Sang-Ho Moon, Yongin (KR); Bo-Kyung Choi, Yongin (KR); Yong-Hwan Park, Yongin (KR); Joon-Hoo Choi, Yongin (KR); Min-Chul Shin, Yongin (KR); Yun-Gyu Lee, Yongin (KR)

(72) Inventors: Won-Kyu Lee, Yongin (KR); Kyu-Sik Cho, Yongin (KR); Tae-Hoon Yang, Yongin (KR); Byoung-Kwon Choo, Yongin (KR); Sang-Ho Moon, Yongin (KR); Bo-Kyung Choi, Yongin (KR); Yong-Hwan Park, Yongin (KR); Joon-Hoo Choi, Yongin (KR); Min-Chul Shin, Yongin (KR); Yun-Gyu Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 53 days.

(21) Appl. No.: 13/945,236

(22) Filed: Jul. 18, 2013

(65) Prior Publication Data
US 2013/0302928 A1   Nov. 14, 2013

Related U.S. Application Data

(62) Division of application No. 12/941,930, filed on Nov. 8, 2010, now Pat. No. 8,502,206.

(30) Foreign Application Priority Data

Nov. 10, 2009   (KR) .......................... 10-2009-0108062

(51) Int. Cl.
| | | |
|---|---|---|
| *H01L 29/08* | (2006.01) | |
| *H01L 51/56* | (2006.01) | |
| *H01L 27/12* | (2006.01) | |
| *H01L 27/32* | (2006.01) | |

(52) U.S. Cl.
CPC ............ *H01L 51/56* (2013.01); *H01L 27/1214* (2013.01); *H01L 27/1251* (2013.01); *H01L 27/3262* (2013.01); *H01L 2227/323* (2013.01)
USPC .................... 438/34; 438/82; 438/83; 438/99; 438/725; 438/780

(58) Field of Classification Search
CPC ......... H01L 51/52; H01L 51/56; H01L 29/08; H01L 29/786
USPC .................. 438/34, 158, 83, 99, 82, 725, 780
See application file for complete search history.

(56) References Cited

U.S. PATENT DOCUMENTS

| | | | |
|---|---|---|---|
| 7,588,970 B2 * | 9/2009 | Ohnuma et al. ............... | 438/149 |
| 2002/0053669 A1 * | 5/2002 | Suzawa et al. .................... | 257/59 |
| 2002/0187594 A1 * | 12/2002 | Yamazaki et al. ............. | 438/166 |
| 2003/0082859 A1 * | 5/2003 | Ichijo et al. .................... | 438/166 |
| 2004/0121602 A1 * | 6/2004 | Maruyama et al. ........... | 438/689 |
| 2007/0120143 A1 | 5/2007 | Huh et al. | |
| 2008/0251786 A1 | 10/2008 | Choi et al. | |

FOREIGN PATENT DOCUMENTS

| | | |
|---|---|---|
| CN | 1512830 | 7/2004 |
| CN | 101572274 | 11/2009 |
| JP | 2004-213004 | 7/2004 |
| KR | 10-2006-0105958 | 10/2006 |
| KR | 10-2008-0100865 | 1/2008 |
| KR | 10-2008-0059804 | 7/2008 |
| KR | 10-2008-0109384 | 12/2008 |
| KR | 10-2008-0113782 | 12/2008 |

\* cited by examiner

*Primary Examiner* — Chuong A Luu
(74) *Attorney, Agent, or Firm* — Knobbe Martens Olson & Bear LLP

(57) ABSTRACT

An organic light emitting diode (OLED) display device and a method of fabricating the same are disclosed. The OLED display device includes a plurality of scan lines, a plurality of data lines, and a plurality of pixels disposed in a region in which the scan lines cross the data lines, where each pixel of the plurality of pixels includes: a switching transistor including a first gate electrode, a first semiconductor layer disposed over the first gate electrode, a first gate insulating layer interposed between the first gate electrode and the first semiconductor layer, a first source electrode and a first drain electrode, a driving transistor including a second semiconductor layer, a second gate electrode disposed over the second semiconductor layer, a second gate insulating layer interposed between the second gate electrode and the second semiconductor layer, a second source electrode and a second drain electrode, and an organic light emitting diode electrically connected with the second source and second drain electrodes of the driving transistor, where the first and second semiconductor layers are formed of the same material, and from the same processing.

10 Claims, 8 Drawing Sheets

ORGANIC LIGHT EMITTING DIODE DISPLAY DEVICE AND METHOD OF FABRICATING THE SAME

CROSS-REFERENCE TO RELATED APPLICATIONS

This application claims priority to U.S. patent application Ser. No. 12/941,930, filed on Nov. 8, 2010, to be issued as U.S. Pat. No. 8,502,206, titled "Organic Light Emitting Diode Display Device And Method Of Fabricating The Same", which claims the benefit of Korean Patent Application No. 2009-108062, filed Nov. 10, 2009, the disclosures of which are hereby incorporated herein by reference in their entireties.

BACKGROUND

1. Field

This disclosure relates to an organic light emitting diode (OLED) display device which can realize an image using an organic emitting material, and a method of fabricating the same.

2. Description of the Related Technology

An OLED display device is a display device emitting light with a specific wavelength using energy generated from excitons generated by recombining electrons and holes, which are injected into an emitting layer from a cathode and an anode.

The OLED display devices are classified into a passive matrix type and an active matrix type. The active matrix OLED display device generally includes two thin film transistors (TFTs) to drive an organic light emitting diode (OLED) including the organic thin film. The two transistors may include a driving transistor applying a driving current to the OLED and a switching transistor transmitting a data signal to the driving transistor, thereby determining on/off of the driving transistor. Thus, compared to the passive matrix OLED display device, it has a relatively more complicated fabricating process.

The passive matrix OLED display device is typically applied in applications such as low-resolution and small-sized display devices. The active matrix OLED display device can generally exhibit stable brightness according to a uniform current provided using the switching and driving transistors disposed in each pixel of a display region, and have low power consumption, so that it can be used in high-resolution and large-sized display devices.

Generally, the thin film transistors, such as the switching or driving transistors include a semiconductor layer, a gate electrode disposed on one side of the semiconductor layer to control current flow by the semiconductor layer, and source and drain electrodes connected to opposite ends of the semiconductor layer, respectively, to transfer a certain amount of current through the semiconductor layer. The semiconductor layer may be formed of polycrystalline silicon (poly-Si) or amorphous silicon (a-Si). Since the poly-Si has a higher electron mobility than the a-Si, the poly-Si is generally more frequently used.

To form a semiconductor layer using the poly-Si, an a-Si layer is typically formed on a substrate and crystallized by one of solid phase crystallization (SPC), rapid thermal annealing (RTA), metal induced crystallization (MIC), metal induced lateral crystallization (MILC), excimer laser annealing (ELA), and sequential lateral solidification (SLS).

SUMMARY OF CERTAIN INVENTIVE ASPECTS

Embodiments of the present invention provide an OLED display device which can prevent a decrease in process efficiency and increase emitting efficiency by forming a switching transistor and a driving transistor in structures suitable for different roles in each pixel through a relatively simple process, and a method of fabricating the same.

One aspect is an organic light emitting diode (OLED) display device, including: a plurality of scan lines, a plurality of data lines, and a plurality of pixels disposed in a region in which the scan lines cross the data lines, where each pixel of the plurality of pixels includes: a switching transistor including a first gate electrode, a first semiconductor layer disposed over the first gate electrode, a first gate insulating layer interposed between the first gate electrode and the first semiconductor layer, a first source electrode and a first drain electrode, a driving transistor including a second semiconductor layer, a second gate electrode disposed over the second semiconductor layer, a second gate insulating layer interposed between the second gate electrode and the second semiconductor layer, a second source electrode and a second drain electrode, and an organic light emitting diode electrically connected with the second source and second drain electrodes of the driving transistor, where the first and second semiconductor layers are formed of the same material, and from the same processing.

The first and second semiconductor layers may be formed of polycrystalline silicon (poly-Si).

The poly-Si for the first and second semiconductor layers may have the same crystalline structure.

Each pixel may further include a first ohmic contact layer interposed between the first semiconductor layer and the first source and first drain electrodes, and a second ohmic contact layer interposed between the second semiconductor layer and the second source and second drain electrodes.

The first and second ohmic contact layers may be formed of amorphous silicon doped with impurities.

Each pixel may further include a first etch stop layer disposed on a partial region of the first semiconductor layer, and a second etch stop layer disposed on a partial region of the second semiconductor layer.

The OLED may include a lower electrode electrically connected with the second source and second drain electrodes, an organic layer disposed over the lower electrode and including one or more emission layers, and an upper electrode disposed over the organic layer.

The second gate electrode may be disposed over the second source and second drain electrodes.

The first source and first drain electrodes may be formed of the same material and from the same processing as the second source and drain electrodes.

Another aspect is a method of fabricating an organic light emitting diode (OLED) display device, including: providing a substrate having first and second regions, forming a first gate electrode over the first region of the substrate, forming a first gate insulating layer over the first gate electrode, forming a polycrystalline silicon (poly-Si) layer over the first gate insulating layer, forming a conductive material layer over the poly-Si layer, etching the poly-Si layer and the conductive material layer, and forming a first semiconductor layer, a first source electrode and a first drain electrode in the first region, and a second semiconductor layer, a second source electrode and a second drain electrode in the second region, where the first and second semiconductor layers are formed of the same material from the same processing, forming a second gate insulating layer over the first and second source and drain electrodes, forming a second gate electrode over the second region of the second gate insulating layer, forming a protective layer on the second gate electrode, etching the protective layer and the second gate insulating layer, and forming a via hole exposing one of the second source and drain electrodes, and forming an OLED including a lower electrode electrically connected with the second source and drain electrodes through the via hole on the protective layer.

The method may further include crystallizing the a-Si layer into the poly-Si layer.

The method may further include: forming an amorphous silicon layer over the poly-Si layer, forming a conductive material layer over the a-Si layer, and etching the a-Si layer doped with impurities through an etching process for the poly-Si layer and the conductive material layer, and forming a first ohmic contact layer between the first semiconductor layer and the first source and first drain electrodes, and a second ohmic contact layer between the second semiconductor layer and the second source and second drain electrodes.

The method may further include forming a first etch stop layer over a first region of the poly-Si layer and a second etch stop layer over a second region of the poly-Si layer.

The method may further include forming the first and second etch stop layers along partial regions of the first and second semiconductor layers.

The method may further include: etching the second gate insulating layer and forming a first contact hole exposing one of the first source and drain electrodes, and electrically connecting the second gate electrode with the first source and first drain electrodes through a second contact hole.

The method may further include: etching the second gate insulating layer and forming a second contact hole exposing one of the second source and second drain electrodes, forming an interconnection electrically connected with the second source and second drain electrodes through the second contact hole along with the second gate electrode, and electrically connecting the lower electrode with the interconnection by exposing the interconnection through the via hole.

The method may further include forming the first and second gate electrodes using the same material and the same process.

The OLED may be formed by forming a pixel defining layer partially exposing the lower electrode over the protective layer, forming an organic layer including one or more emission layers over the lower electrode exposed by the pixel defining layer, and forming an upper electrode over the organic layer.

The method may further include: forming a planarization layer over the protective layer, forming a via hole by etching the protective layer and the planarization layer, and forming a lower electrode electrically connected with the second source and second drain electrodes through the via hole over the planarization layer.

Additional aspects and/or advantages of embodiments of the invention will be set forth in part in the description which follows and, in part, will be obvious from the description, or may be learned by practice of the invention.

BRIEF DESCRIPTION OF THE DRAWINGS

The above and other objects, features and advantages will be described in reference to the attached drawings in which.

DETAILED DESCRIPTION OF CERTAIN INVENTIVE EMBODIMENTS

Figure 1:
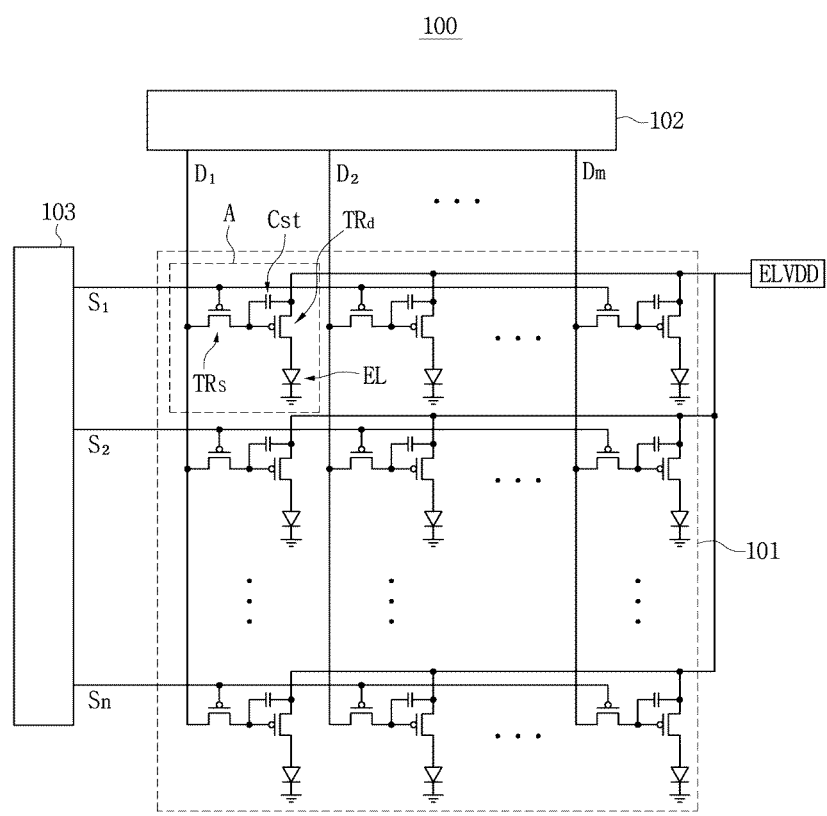
FIG. 1 is a schematic diagram of an embodiment of an OLED display device.

Embodiments of the present invention will now be described more fully hereinafter with reference to the accompanying drawings. Like numerals generally denote the like elements throughout the specification, and when one element is "connected with another element, these elements may be "directly connected" with each other, or "electrically connected" with each other having another element therebetween. Moreover, in the drawings, thicknesses of layers and regions may be exaggerated for clarity.

An active matrix OLED display device generally includes switching and driving transistors having the same structure in each pixel. The driving transistor is to provide a certain minimum amount of driving current to the OLED. Thus, high current drivability is typically required in driving transistors. On the other hand, the switching transistor should typically maintain a low leakage current as it has to accurately determine the on/off state of the driving transistor. However, typically the switching and driving transistors are fabricated to have the same structure to maintain or improve manufacturing efficiency. Accordingly, the switching and driving transistors in the same structure cannot adequately satisfy the different roles thereof, which may result in a decrease in emitting efficiency.

To better fulfill the different roles, the switching and driving transistors are designed differently and manufactured separately, which may result in a possible decrease in manufacturing process efficiency. According to various embodiments of the present invention, the switching transistor and driving transistor are in different configurations while minimizing decrease in manufacturing efficiency. FIG. 1 is a schematic diagram of an embodiment of an OLED display device, and FIG. 2 is a plan view of a single pixel of an embodiment of the OLED display device.

Figure 2:
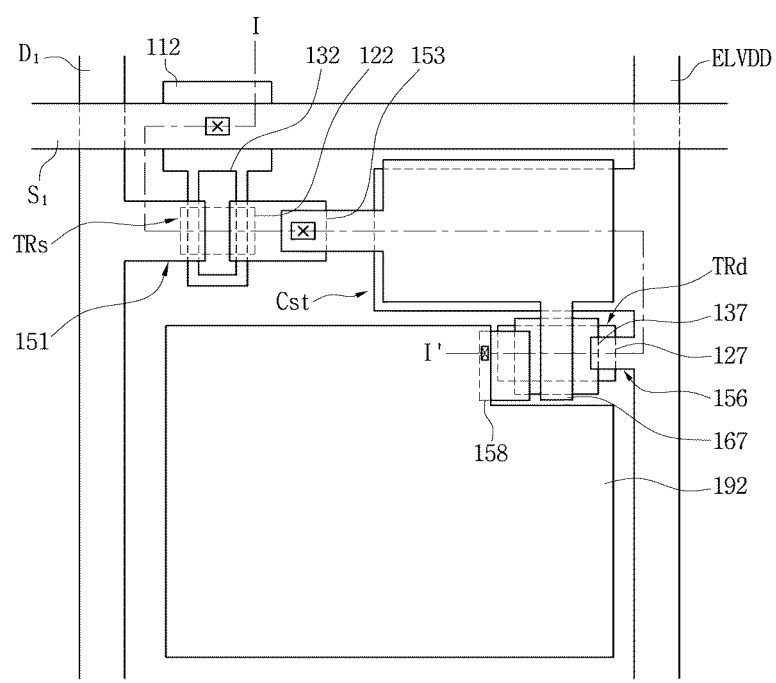
FIG. 2 is a plan view of a single pixel of an embodiment of the OLED display device.

Referring to FIGS. 1 and 2, an embodiment of the OLED display device 100 includes a pixel part 101, which displays an image, a data driver 102, which applies a data signal to the pixel part 101 through a plurality of data lines D1 through Dm, and a scan driver 103, which applies a scan signal to the pixel part 101 through a plurality of scan lines S1 through Sn. The pixel part 101 includes a plurality of pixels P disposed in a region in which the scan lines cross the data lines.

Each pixel P includes (1) an OLED emitting layer (EL) expressing a color in response to the data signal, (2) a driving transistor TRd providing a driving current to the OLED EL in response to the data signal, (3) a switching transistor TRs transmitting the data signal in response to the scan signal to turn on/off the driving transistor TRd, and (4) a capacitor Cst storing a voltage corresponding to the data signal. In some embodiments, the pixel P may further include a plurality of thin film transistors (not shown) and capacitors (not shown) to compensate a threshold voltage of the driving transistor TRd.

The switching transistor TRs includes a first gate electrode 112 electrically connected with one of the scan lines S1 through Sn, a first semiconductor layer 122 disposed on the first gate electrode 112, and first source/drain electrodes 151 and 153 electrically connected with opposite ends of the first semiconductor layer 122.

The driving transistor TRd includes a second semiconductor layer 127 disposed on the same layer as the first semiconductor layer 122, a second gate electrode 167 disposed on the second semiconductor layer 127, and second source and drain electrodes 156 and 158 electrically connected with opposite ends of the second semiconductor layer 127. In some embodiments, the second gate electrode 167 may be electrically connected with the drain electrode 153.

Figure 3A:
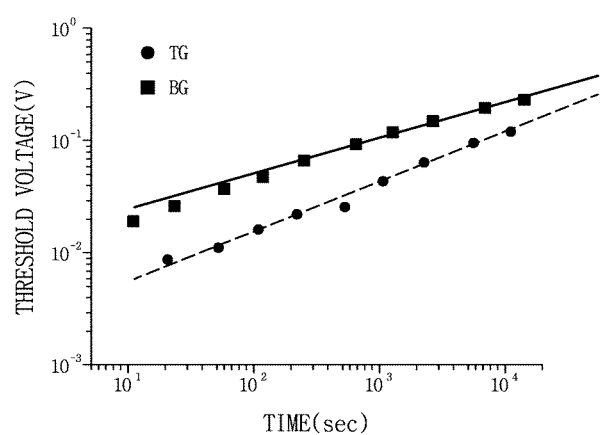
FIGS. 3A and 3B are graphs showing comparison of driving characteristics between an inverted staggered (BG) thin film transistor and a staggered (TG) thin film transistor.
Figure 3B:
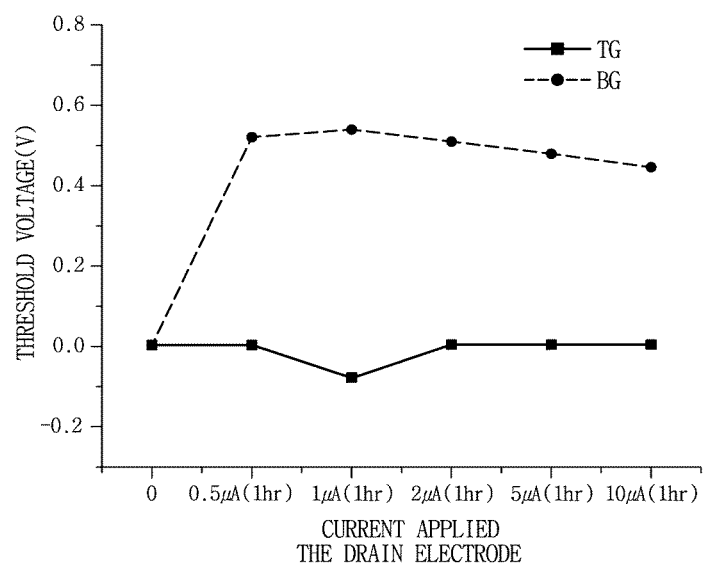

FIGS. 3A and 3B are graphs showing comparisons of driving characteristics between an inverted staggered (BG) thin film transistor in which a gate electrode is disposed under a semiconductor layer and a staggered (TG) thin film transistor in which a semiconductor layer is disposed under a gate electrode. In other words, in an inverted staggered (BG) thin film transistor, the gate electrode is disposed between the substrate and the semiconductor layer, whereas in a staggered (TG) thin film transistor, the semiconductor layer is disposed between the substrate and the gate electrode. FIG. 3A illustrates a change in threshold voltage according to time when −20 V is applied to the gate electrode, and FIG. 3B illustrates a change in threshold voltage according to a current applied to the drain electrode when 10 V is applied to the gate electrode.

Referring to FIG. 3A, when an amount of negative voltage is continuously applied to the gate electrode, a slope of the change in threshold voltage according to time is 0.4577 for the staggered (TG) thin film transistor, and 0.3212 for the inverted staggered (BG) thin film transistor. Compared to the staggered (TG) thin film transistor, the inverted staggered (BG) thin film transistor has relatively less change in threshold voltage according to time.

Referring to FIG. 3B, when an amount of positive voltage is continuously applied to the gate electrode, and a current applied to the drain electrode is increased over time, 0.08 V of a threshold voltage transfers in the staggered (TG) thin film transistor, and 0.54 V of a threshold voltage transfers in the inverted staggered (BG) thin film transistor. The staggered (TG) thin film transistor has relatively less change in threshold voltage according to the change in current applied to the drain electrode than the inverted staggered (BG) thin film transistor. In other words, the change in drain electric field is lower in the staggered (TG) thin film transistor than in the inverted staggered (BG) thin film transistor.

Accordingly, to transmit a data signal in response to the scan signal, an embodiment of the OLED display device 100 may include an inverted staggered (BG) thin film transistor as the switching transistor TRs, which ideally exhibits a low leakage current, and a staggered (TG) thin film transistor as the driving transistor TRd, which generally requires a high driving characteristic. These transistors would produce and apply various driving currents to the OLED EL in response to the data signal. Thus, the OLED display device 100 may exhibit improved emitting efficiency.

FIGS. 4A through 4G are cross-sectional views taken along line I-I' of FIG. 2, and illustrate an embodiment of a method of fabricating an embodiment of an OLED display device 100.

Figure 4A:
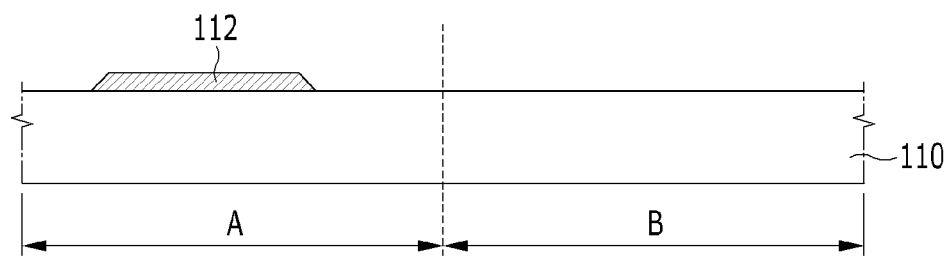
FIGS. 4A through 4G are cross-sectional views sequentially illustrating an embodiment of a method of fabricating an embodiment of an OLED display device.

As shown in FIG. 4A, an embodiment of an OLED display device 100 includes a first conductive material layer (not shown) formed on a substrate 110 having a first region A and a second region B. The substrate may be formed of glass, synthetic resin, or stainless steel. The OLED display device further includes a first gate electrode 112 disposed on the first region A of the substrate 110, formed by etching the first conductive material layer. In some embodiments, the first conductive material layer may be a metal layer formed in a single layer of aluminum (A) or an Al alloy such as aluminum-neodymium (Al—Nd), or a multiple layer in which an Al alloy is stacked on a chromium (Cr) or molybdenum (Mo) alloy.

Figure 4B:
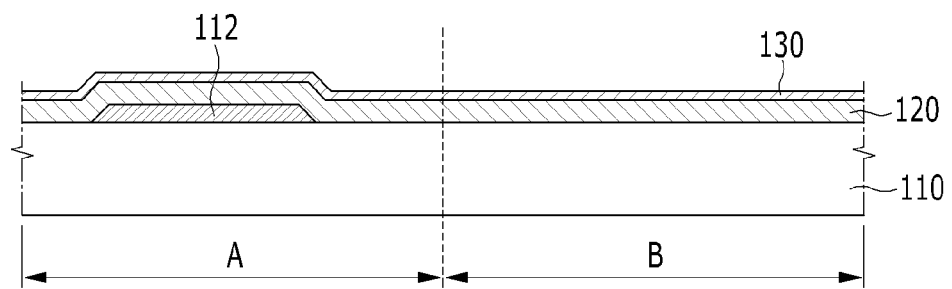

As shown in FIG. 4B, a first gate insulating layer 120 is formed on the substrate 110 including the first gate electrode 112, and a poly-Si layer 130 is formed on the first gate insulating layer 120. In some embodiments, to form the poly-Si layer 130 on the first gate insulating layer 120, an a-Si layer (not shown) may be deposited on the first gate insulating layer 120, and then crystallized into the poly-Si layer 130 by a method selected from SPC, RTA, MIC, MILC, ELA, and SLS.

Figure 4C:
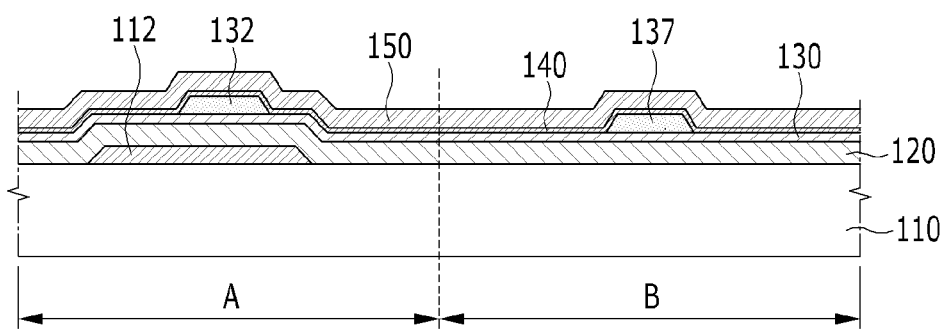

As shown in FIG. 4C, after the a-Si layer 140 is formed on the poly-Si layer 130, the a-Si layer 140 is doped with P-type or N-type impurities, and a second conductive material layer 150 is formed on the a-Si layer 140. In some embodiments, the second conductive material layer 150 may be formed of molybdenum-tungsten (MoW), aluminum (Al), or an Al alloy such as Al-neodymium (Nd).

In some embodiments, in order to prevent deterioration of the driving characteristics of the first and second semiconductor layers 122 and 127 formed by etching the poly-Si layer 130 due to damage to a surface of the poly-Si layer 130 during a subsequent etching process, a first etch stop layer 132 and a second etch stop layer 137 may be formed on the poly-Si layer 130.

Figure 4D:
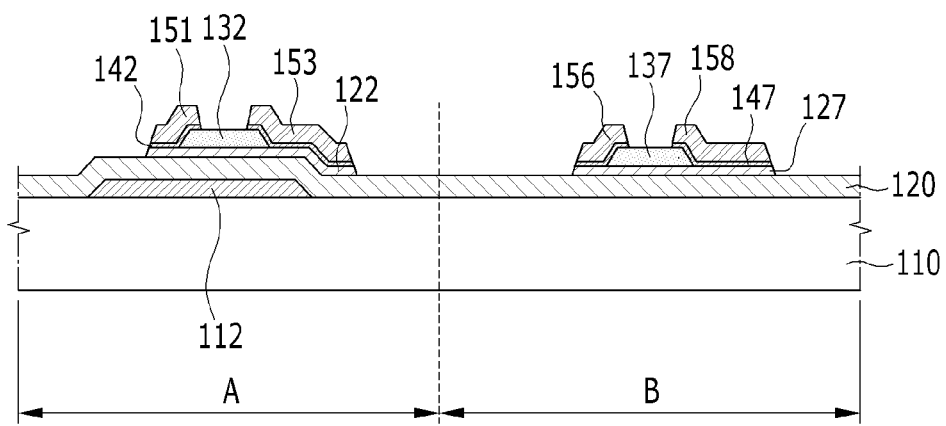

As shown in FIG. 4D, the first and second etch stop layers 132 and 137 are formed to correspond to partial regions of the first and second semiconductor layers 122 and 127 to be formed by a subsequent process. In such embodiments, electrical connections between the first semiconductor layer 122 and the first source and drain electrodes 151 and 153 and between the second semiconductor layer 127 and the second source and drain electrodes 156 and 158 may be easily formed.

Still referring to FIG. 4D, the poly-Si layer 130, the a-Si layer 140 doped with impurities, and the second conductive material layer 150 are etched, thereby forming a first semiconductor layer 122 disposed in the first region A. First source and drain electrodes 151 and 153 are electrically connected with opposite ends of the first semiconductor layer 122, a first ohmic contact layer 142 is interposed between the first semiconductor layer 122 and the first source and drain electrodes 151 and 153, and a second semiconductor layer 127 is disposed in the second region B. Second source and drain electrodes 156 and 158 are electrically connected with opposite ends of the second semiconductor layer 127, and a second ohmic contact layer 147 is interposed between the second semiconductor layer 127 and the second source and drain electrodes 156 and 158.

In some embodiments, the first and second semiconductor layers 122 and 127 are electrically connected with the first source and drain electrodes 151 and 153 or the second source and drain electrodes 156 and 158 through the first and second ohmic contact layers 142 and 147 formed of the a-Si doped with impurities. In other embodiments, the first and second ohmic contact layers 142 and 147 may be formed of poly-Si, source and drain regions (not shown) and a channel region (not shown) may be formed by doping partial regions of the first and second semiconductor layers 122 and 127 with impurities, and the first source and drain electrodes 151 and 153 may be connected with the source and drain regions of the first semiconductor layer 122, and the second source and drain electrodes 156 and 158 may be connected with the source and drain regions of the second semiconductor layer 127.

In some embodiments, the poly-Si layer 130, the a-Si layer 140 doped with impurities and the second conductive material layer 150 may be sequentially stacked and etched, the poly-Si layer 130 may be etched before the formation of the a-Si layer 140 to form the first and second semiconductor layers 122 and 127, the a-Si layer 140 doped with impurities may be formed on the first and second semiconductor layers 122 and 127, and the a-Si layer 140 doped with impurities may be etched before the formation of the second conductive material layer 150 to form the first and second ohmic contact layers 142 and 147.

Figure 4E:
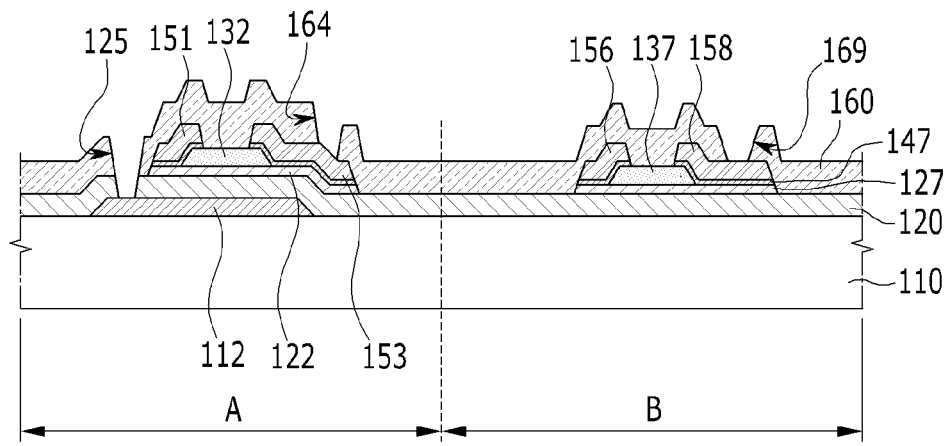

As shown in FIG. 4E, a second gate insulating layer 160 is formed on the first source and drain electrodes 151 and 153 and the second source and drain electrodes 156 and 158, and etched to form a first contact hole 164 partially exposing the first drain electrode 153 of the first source and drain electrodes 151 and 153, a second contact hole 169 partially exposing the second drain electrode 158 of the second source and drain electrodes 156 and 158, and a third contact hole 125 partially exposing the first gate electrode 112.

In some embodiments, the first drain electrode 153 is partially exposed through the first contact hole 164, and the second drain electrode 158 is partially exposed through the second contact hole 169, the first source electrode 151 may be partially exposed through the first contact hole 164, and the second source electrode 156 may be partially exposed through the second contact hole 169.

In some embodiments, the first gate electrode 112 and the scan line S1 may be independently formed. In other embodiments, the first gate electrode 112 may be simultaneously formed with the scan line S1.

Figure 4F:
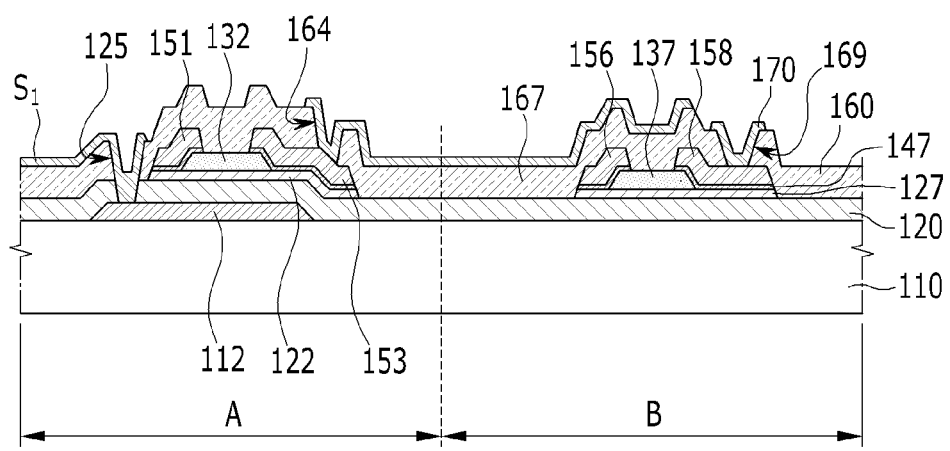

As shown in FIG. 4F, a third conductive material layer (not shown) is formed on the second gate insulating layer 160, and etched to form a scan line S1, a second gate electrode 167 electrically connected with the first drain electrode 153 through the first contact hole 164, and an interconnection 170 electrically connected with the second drain electrode 158.

In some embodiments, the third conductive material layer may be a metal layer formed in a single layer of Al or an Al alloy such as Al—Nd, or a multiple layer in which an Al alloy is stacked on a Cr or Mo alloy, and may be formed of the same material as the first conductive material layer.

Figure 4G:
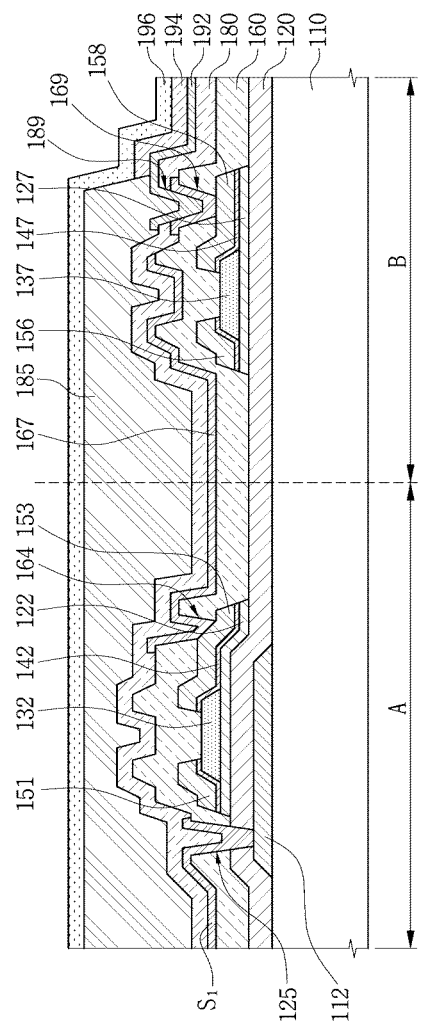

As shown in FIG. 4G, a protection layer 180 is formed on the scan line S1, the second gate electrode 167, and the interconnection 170, and etched to form a via hole 189 partially exposing the interconnection 170, a lower electrode 192 electrically connected with the interconnection 170 through the via hole 189, an organic layer 194 disposed on the lower electrode 192 and including one or more emission layers (not shown), and an upper electrode 196 disposed on the organic layer 194, and thus an OLED is completed.

In some embodiments, to separate adjacent pixels from each other, a pixel defining material layer (not shown) is formed of one selected from the group consisting of polyimide, benzocyclobutene series resin, phenol resin, and acrylate and etched to form a pixel defining layer 185 partially exposing the lower electrode 192, and the organic layer 194 is formed on the lower electrode 192 exposed by the pixel defining layer 185.

The protective layer 180 may be formed of silicon oxide (SiO2), silicon nitride ($SiN_x$) or a combination thereof, and a planarization layer (not shown) may be further formed of an organic insulating layer of acryl or an inorganic insulating layer of silicon oxide on the protective layer 180.

In some embodiments, a lower electrode 192 of the OLED may be electrically connected with the second drain electrode 158 through the interconnection 170. The second contact hole 169 may be simultaneously formed with the via hole 189 for the lower electrode 192 to be in direct contact with the second drain electrode 158. However, because of a step difference between the thicknesses of the second gate insulating layer 192 and the protection layer 180, the lower electrode 192 may be short-circuited with the second drain electrode 158.

In some embodiments, the gate electrode of the switching transistor is formed, the semiconductor layer of the switching transistor is simultaneously formed with the semiconductor layer of the driving transistor, and the gate electrode of the driving transistor is formed on the semiconductor layer. Thus, in each pixel, the switching transistor and the driving transistor, which have different structures for fulfilling different roles, may be formed with a relatively simple process.

In embodiments of the OLED display device and methods of fabricating the same, a switching transistor maintaining a low leakage current by forming one poly-Si layer and a driving transistor having a high drivability are formed, thereby increasing emitting efficiency of the OLED display device in a relatively simple manufacturing process.

Although certain embodiments of the present invention have been described, it will be understood by those skilled in the art that a variety of modifications and variations may be made to the embodiments without departing from the spirit or scope of the present invention defined in the appended claims and their equivalents.

What is claimed is:

1. A method of fabricating an organic light emitting diode (OLED) display device, comprising:
    providing a substrate having first and second regions;
    forming a first gate electrode over the first region of the substrate;
    forming a first gate insulating layer over the first gate electrode;
    forming a polycrystalline silicon (poly-Si) layer over the first gate insulating layer;
    forming a conductive material layer over the poly-Si layer;
    etching the poly-Si layer and the conductive material layer, and forming a first semiconductor layer, a first source electrode and a first drain electrode in the first region, and a second semiconductor layer, a second source electrode and a second drain electrode in the second region, wherein the first and second semiconductor layers are formed of the same material from the same processing;
    forming a second gate insulating layer over the first and second source and drain electrodes;
    forming a second gate electrode over the second region of the second gate insulating layer;
    forming a protective layer on the second gate electrode;
    etching the protective layer and the second gate insulating layer, and forming a via hole exposing one of the second source and drain electrodes; and
    forming an OLED including a lower electrode electrically connected with the second source and drain electrodes through the via hole on the protective layer forming the first and second etch stop layers over and contacting at least a partial regions of the first and second semiconductor layers.

2. The method according to claim 1, further comprising crystallizing the a-Si layer into the poly-Si layer.

3. The method according to claim 1, further comprising:
    forming an amorphous silicon layer over the poly-Si layer;
    forming a conductive material layer over the a-Si layer; and
    etching the a-Si layer doped with impurities through an etching process for the poly-Si layer and the conductive material layer, and forming a first ohmic contact layer between the first semiconductor layer and the first source and first drain electrodes, and a second ohmic contact layer between the second semiconductor layer and the second source and second drain electrodes.

4. The method according to claim 1, further comprising forming a first etch stop layer over a first region of the poly-Si layer and a second etch stop layer over a second region of the poly-Si layer.

5. The method according to claim 4, further comprising forming the first and second etch stop layers along partial regions of the first and second semiconductor layers.

6. The method according to claim 1, further comprising:
etching the second gate insulating layer and forming a first contact hole exposing one of the first source and drain electrodes; and
electrically connecting the second gate electrode with the first source and first drain electrodes through a second contact hole.

7. The method according to claim 1, further comprising:
etching the second gate insulating layer and forming a second contact hole exposing one of the second source and second drain electrodes;
forming an interconnection electrically connected with the second source and second drain electrodes through the second contact hole along with the second gate electrode; and
electrically connecting the lower electrode with the interconnection by exposing the interconnection through the via hole.

8. The method according to claim 1, further comprising forming the first and second gate electrodes using the same material and the same process.

9. The method according to claim 1, wherein the OLED is formed by forming a pixel defining layer partially exposing the lower electrode over the protective layer, forming an organic layer including one or more emission layers over the lower electrode exposed by the pixel defining layer, and forming an upper electrode over the organic layer.

10. The method according to claim 1, further comprising:
forming a planarization layer over the protective layer;
forming a via hole by etching the protective layer and the planarization layer; and
forming a lower electrode electrically connected with the second source and second drain electrodes through the via hole over the planarization layer.

* * * * *